United States Patent
Tai et al.

(10) Patent No.: US 7,473,629 B2
(45) Date of Patent: Jan. 6, 2009

(54) SUBSTRATE STRUCTURE HAVING A SOLDER MASK AND A PROCESS FOR MAKING THE SAME

(75) Inventors: Wei-Chang Tai, Kaohsiung (TW); Chi-Chih Chu, Kaohsiung (TW); Meng-Jung Chuang, Kaohsiung (TW); Cheng-Yin Lee, Kaohsiung (TW); Yao-Ting Huang, Kaohsiung (TW); Kuang-Lin Lo, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/634,059

(22) Filed: Dec. 6, 2006

(65) Prior Publication Data
US 2007/0243704 A1   Oct. 18, 2007

(30) Foreign Application Priority Data
Apr. 13, 2006  (TW) .............................. 95113167 A (51) Int. Cl.
*H01L 21/44* (2006.01)

(52) U.S. Cl. ................. 438/613; 257/E21.508

(58) Field of Classification Search .......... 257/E21.508; 438/613
See application file for complete search history.

(56) References Cited

U.S. PATENT DOCUMENTS

| 6,779,783 B2 | 8/2004 | Kung et al. |
| 6,825,569 B2 | 11/2004 | Jiang et al. |
| 6,833,609 B1 * | 12/2004 | Fusaro et al. ............... 257/668 |
| 2005/0090035 A1 * | 4/2005 | Kim .......................... 438/70 |
| 2006/0154397 A1 * | 7/2006 | Takahashi et al. ............. 438/34 |

FOREIGN PATENT DOCUMENTS

TW            498472        8/2002

* cited by examiner

*Primary Examiner*—Asok K Sarkar
(74) *Attorney, Agent, or Firm*—Volentine & Whitt, P.L.L.C.

(57) ABSTRACT

A substrate structure having a solder mask and a process for making the same, including (a) providing a substrate having a top surface, the top surface having a die pad and a plurality of solder pads; (b) forming a first solder mask on the top surface, the first solder mask having a plurality of openings, each opening corresponding to each solder pad so as to expose at least part of the solder pad; and (c) forming a second solder mask on the first solder mask. The substrate structure can be used for packaging a thicker die so as to prevent the die crack and the overflow of molding compound will be avoided.

9 Claims, 9 Drawing Sheets

FIG.6

SUBSTRATE STRUCTURE HAVING A SOLDER MASK AND A PROCESS FOR MAKING THE SAME

BACKGROUND OF THE INVENTION

1. Field of the Invention

The invention relates to a substrate structure and a process for making the same, particularly to a packaging structure having a solder mask and a process for making the same.

2. Description of the Related Art

Figure 1:
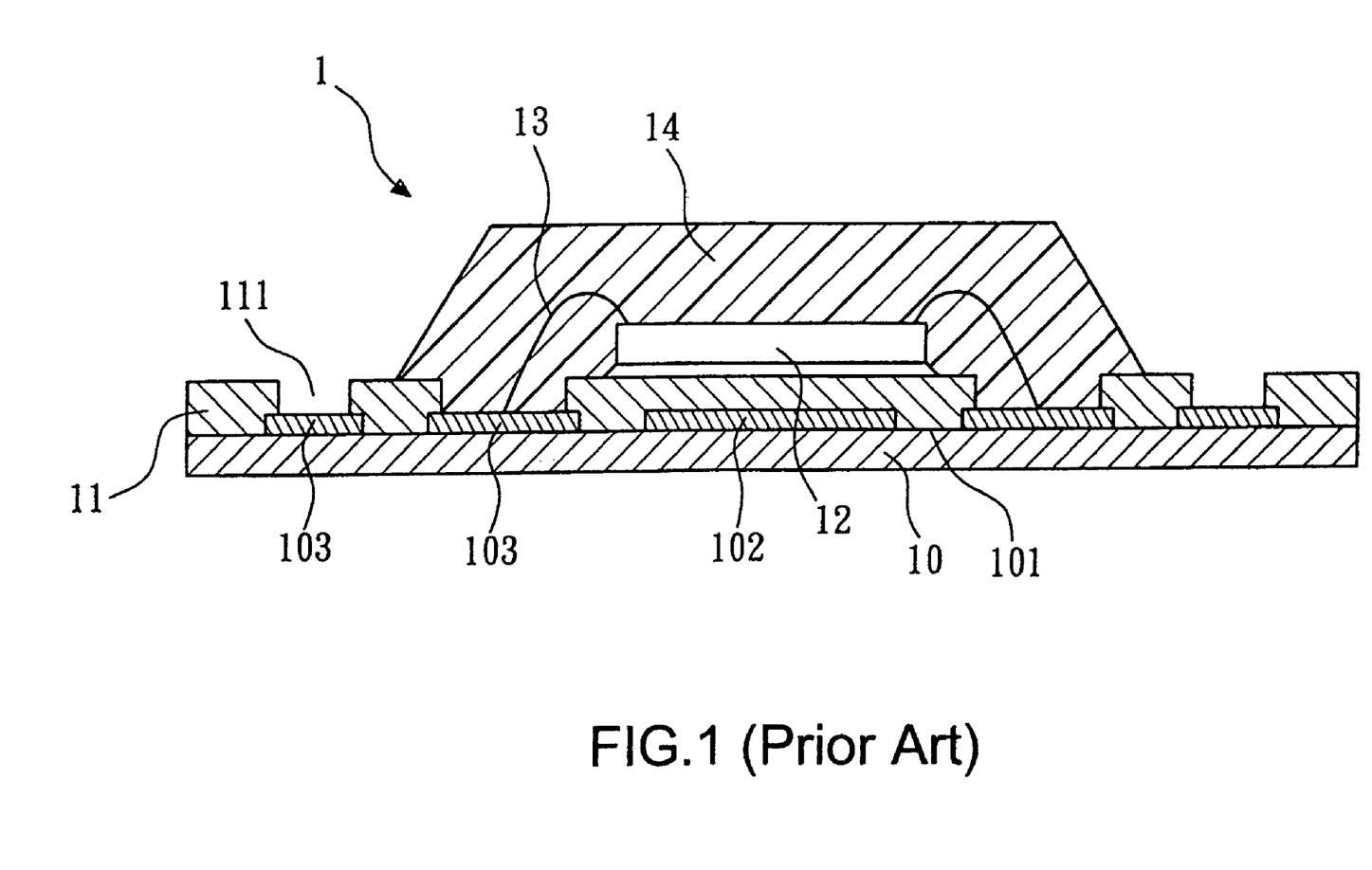
FIG. 1 shows a conventional substrate structure.

Referring to FIG. 1, it shows a conventional substrate structure. The structure 1 of the invention comprises a substrate 10, a solder mask 11, a die 12, a plurality of wires 13 and molding compound 14. The substrate 10 has a top surface 101. The top surface 101 has a die pad 102 and a plurality of solder pads 103. The solder mask 11 is formed on the top surface 101. The solder mask 11 has a plurality of openings 111. The openings 111 are formed by using exposure and development. Each opening 111 is corresponding to each solder pad 103 to expose part of the solder pad 103.

The die 12 is attached on the solder mask 11 correspondingly on the die pad 102. The wires 13 are used to electrically connect the die 12 and the solder pads 103. The molding compound 14 is used to encapsulate the wires 13, the die 12 and the solder pads 103 to form the package 1.

For the above-mentioned package 1, the solder mask 11 for disposing the die 12 has the same height as that of the solder mask 111 for exposing the solder pads 103. Therefore, a thinner die should be used to be packaged, and it is easy to cause the die 12 crack. Furthermore, the solder mask 11 cannot avoid the overflow of molding compound so that the solder pads 103 will be polluted.

Consequently, there is an existing need for providing a substrate structure having a solder mask and a process for making the same to solve the above-mentioned problems.

SUMMARY OF THE INVENTION

One objective of the present invention is to provide a method for making a substrate structure having a solder mask. The process of the invention comprises the steps of: (a) providing a substrate having a top surface, the top surface having a die pad and a plurality of solder pads; (b) forming a first solder mask on the top surface, the first solder mask having a plurality of openings, each opening corresponding to each solder pad so as to expose at least part of the solder pad; and (c) forming a second solder mask on the first solder mask.

Another objective of the present invention is to provide a substrate structure having a solder mask. The structure of the invention comprises a substrate and a solder mask. The substrate has a top surface having a die pad and a plurality of solder pads. The solder mask is formed on the top surface. The solder mask has a plurality of openings. Each opening is corresponding to each solder pad so as to expose part of the solder pad. The solder mask has a first portion and a second portion. The first portion is correspondingly on the die pad, and the second portion is around the edge of the top surface of the substrate. The first portion is lower than the second portion.

The solder mask of the above-mentioned structure of the invention is a single structure. By utilizing the higher second portion of the solder mask, a thicker die can be used to be packaged so as to prevent the die crack. Furthermore, the second portion is stair-shaped, and a ring-shaped groove also can be formed on the second portion, so that the overflow of molding compound will be avoided, and the solder pads will not be polluted.

Still, another objective of the present invention is to provide a substrate structure having a solder mask. The structure of the invention comprises a substrate, a first solder mask and a second solder mask. The substrate has a top surface having a die pad and a plurality of solder pads. The first solder mask is formed on the top surface. The first solder mask has a plurality of openings. Each opening is corresponding to each solder pad so as to expose part of the solder pad. The second solder mask is formed on part of the first solder mask.

The solder mask of the above-mentioned structure of the invention is a delaminated structure. Since the second solder mask is formed on part of the first solder mask to form a higher solder mask, a thicker die can be used to be packaged so as to prevent the die crack. Furthermore, the first solder mask and the second solder mask form a stair-shaped structure, and a ring-shaped groove may be formed on the second solder mask. Therefore, the overflow of molding compound will be avoided, and the solder pads will not be polluted.

BRIEF DESCRIPTION OF THE DRAWINGS

FIGS. 2A to 2H show the processes for making a substrate structure having a solder mask according to the present invention, wherein

DETAILED DESCRIPTION OF THE INVENTION

Figure 2A:
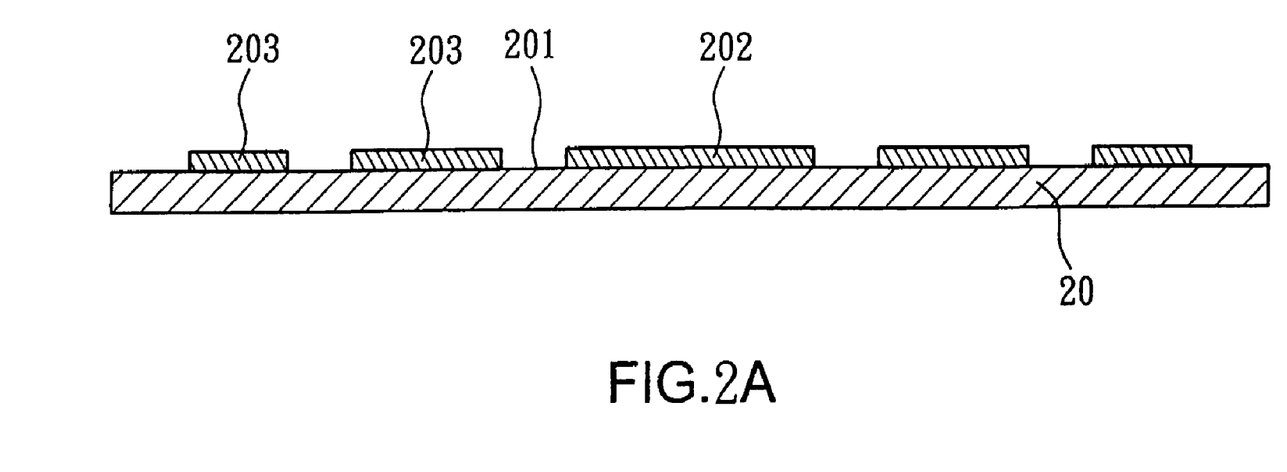
Figure 2B:
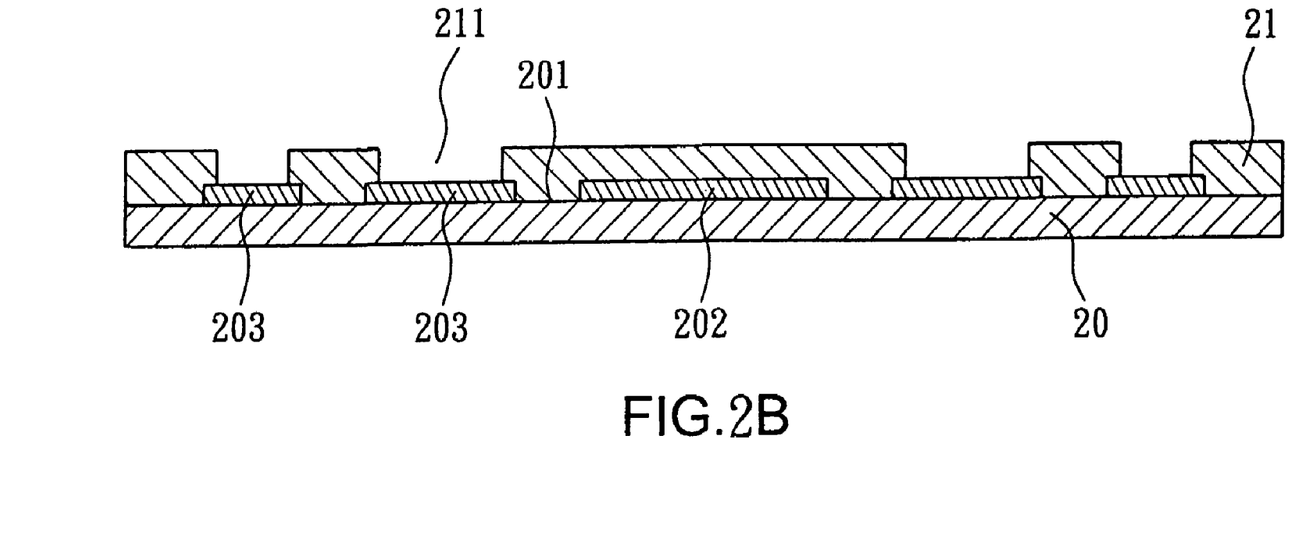

Referring to FIGS. 2A to 2D, they show the processes for making a substrate structure having a solder mask according to the present invention. Referring to FIG. 2A, firstly, a substrate 20 is provided. The substrate 20 has a top surface 201, and the top surface 201 has a die pad 202 and a plurality of solder pads 203. Referring to FIG. 2B, a first solder mask 21 is formed on the top surface 201. The first solder mask 21 has a plurality of openings 211. Each opening 211 is corresponding to each solder pad 203 so as to expose the solder pad 203. In the embodiment, the openings 211 are formed by using exposure and development.

Figure 2C:
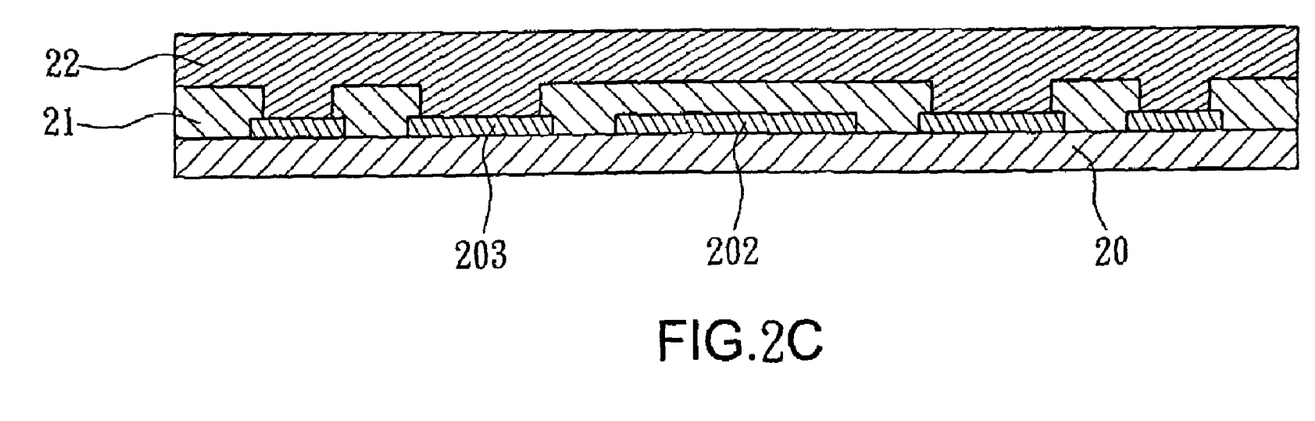
Figure 2D:
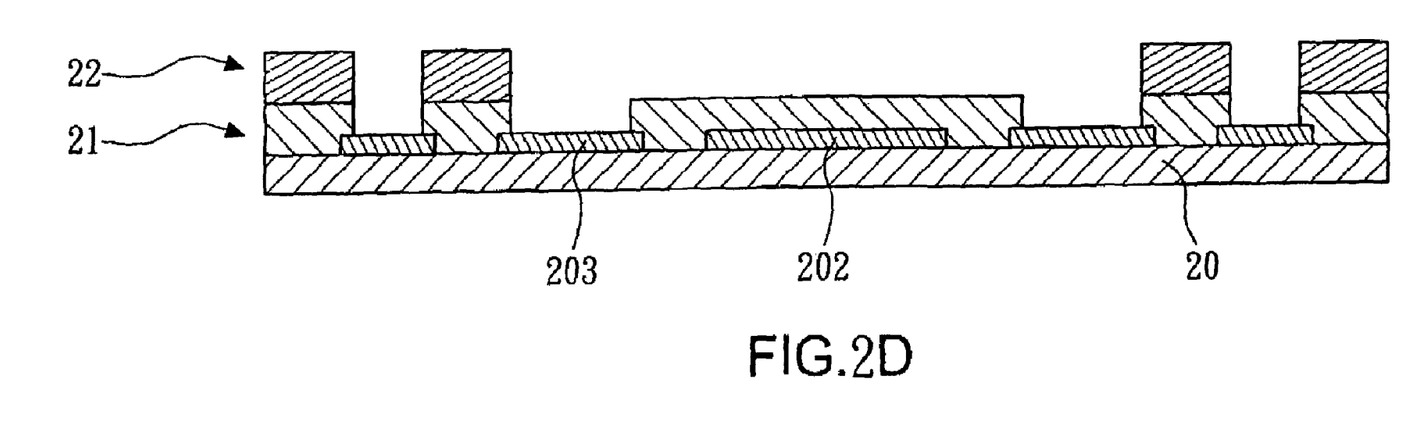
Figure 2E:
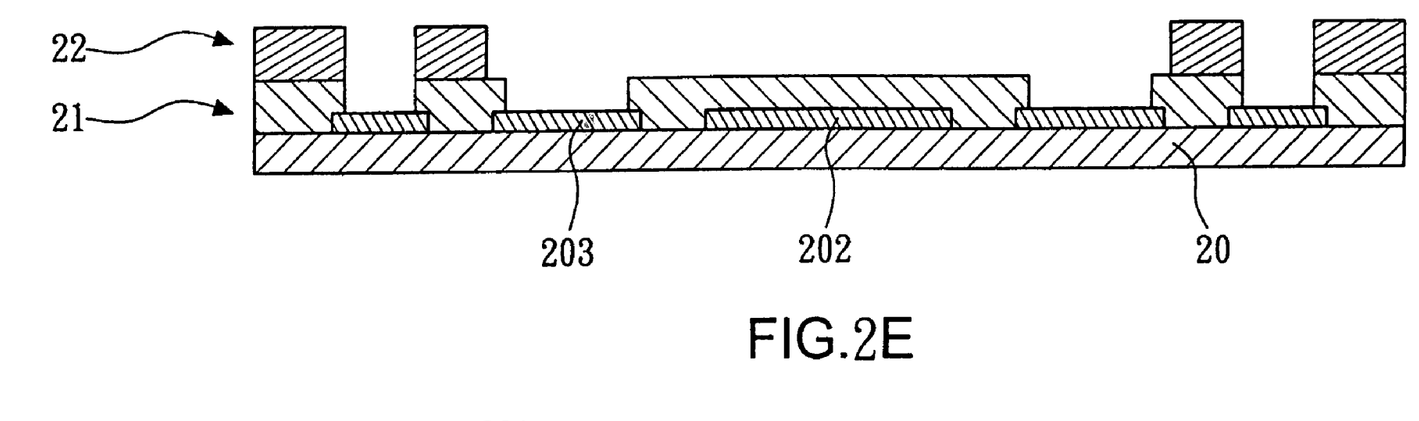
Figure 2F:
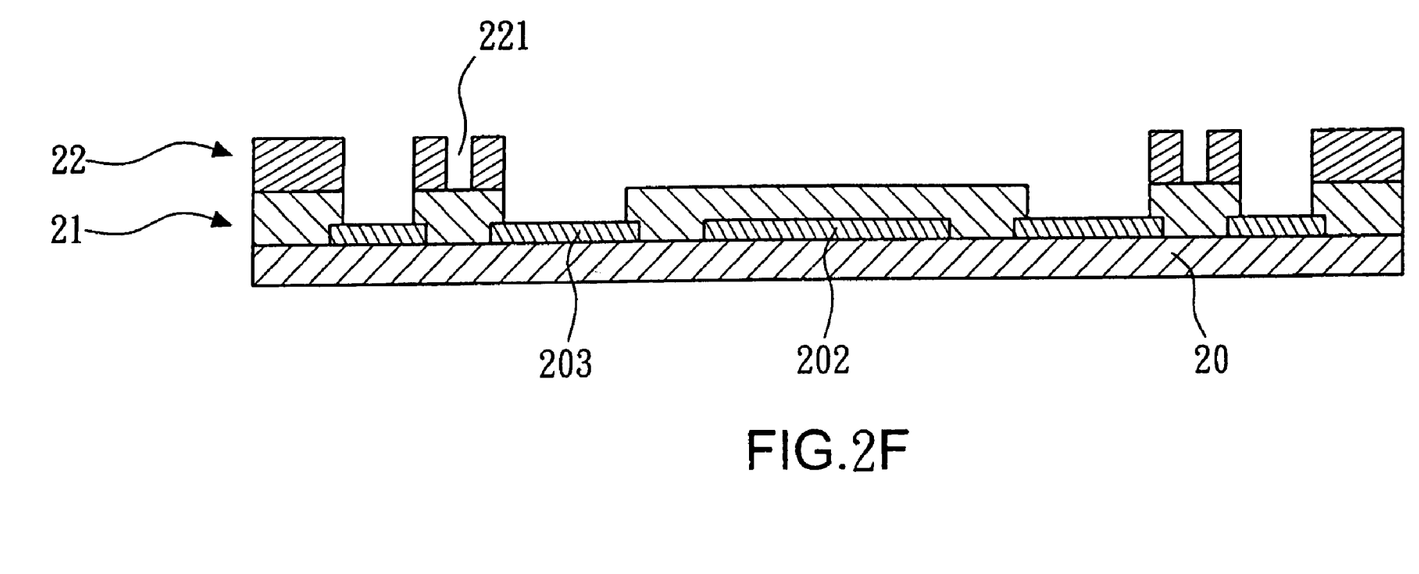

Referring to FIG. 2C, a second solder mask 22 is formed on the first solder mask 21 and the solder pads 203. Referring to FIG. 2D, part of the second solder mask 22 is then removed by using exposure and development so as to expose part of the solder pads 203 and the first solder mask 21. The exposed part of the first solder mask 21 is corresponding to the die pad 202. A top mold (not shown) presses the second solder mask 22 so as to form a higher space for disposing the die when molding. For another application, part of the first solder mask 21 and part of the second solder mask 22 form a stair-shaped structure, as shown in FIG. 2E. For another application, a groove 221 may be formed on the second solder mask 22 by using exposure and development, as shown in FIG. 2F. When molding, the groove 221 can be used as a buffering flow channel so that the overflow of molding compound will be avoided.

Figure 2G:
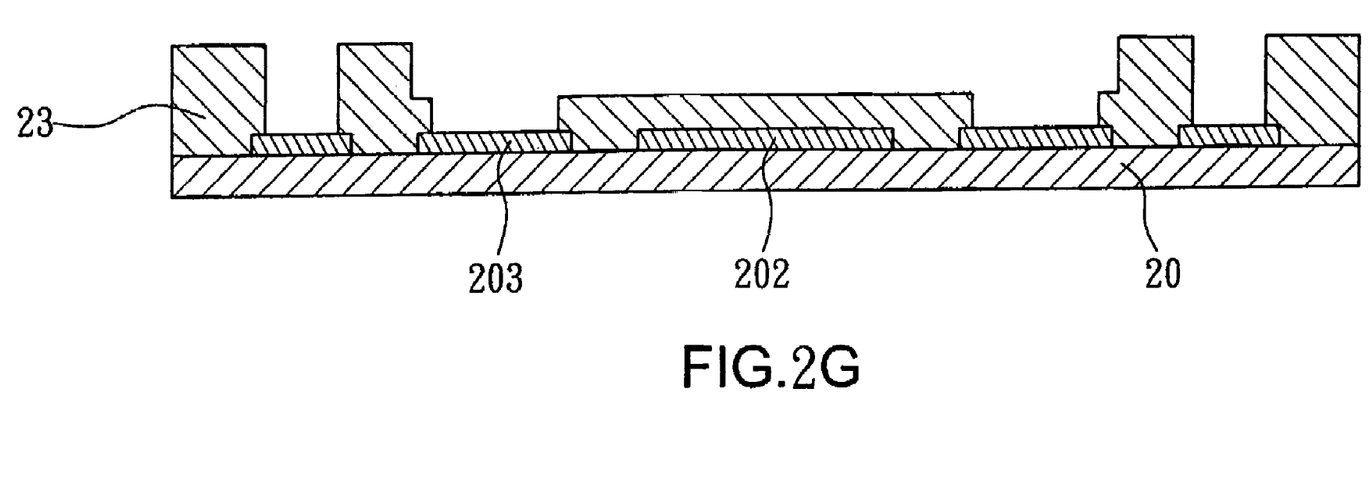
FIG. 2G shows a first type of the substrate structure having a solder mask of the present invention.
Figure 2H:
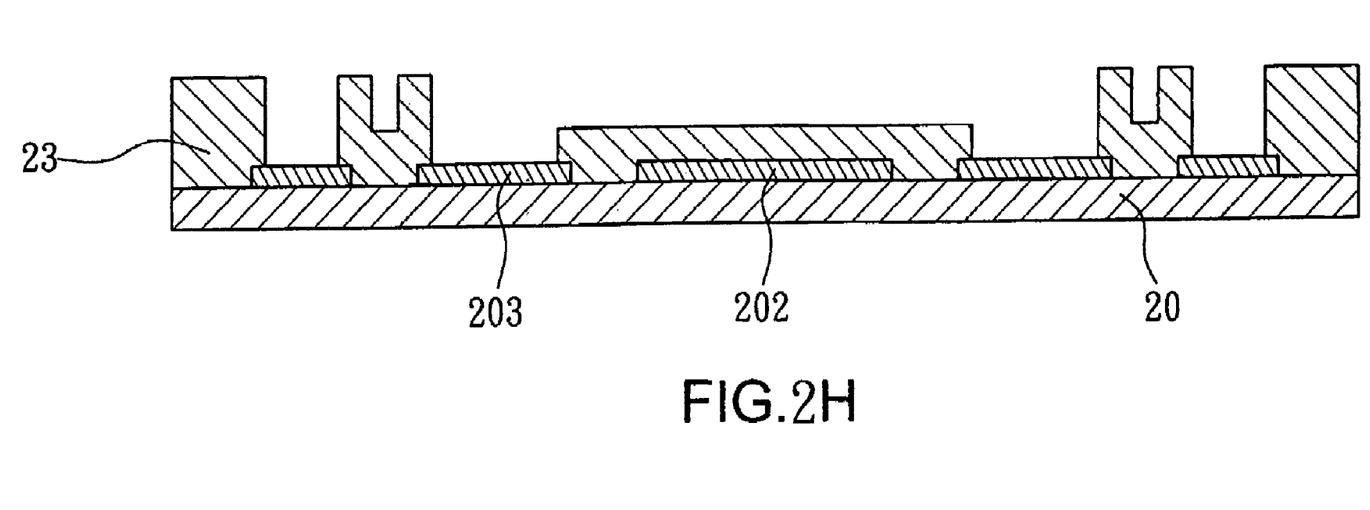
FIG. 2H shows a second type of the substrate structure having a solder mask according to the present invention.

Referring to FIGS. 2G to 2H, the first solder mask 21 and the second solder mask 22 are heated and melt together to form a third solder mask 23. It should be noticed that the first solder mask 21 and the second solder mask 22 may be a delaminated structure after heating, as shown in FIG. 2E and FIG. 2F, and that actually depends on the baking sequence and heating conditions.

Figure 3:
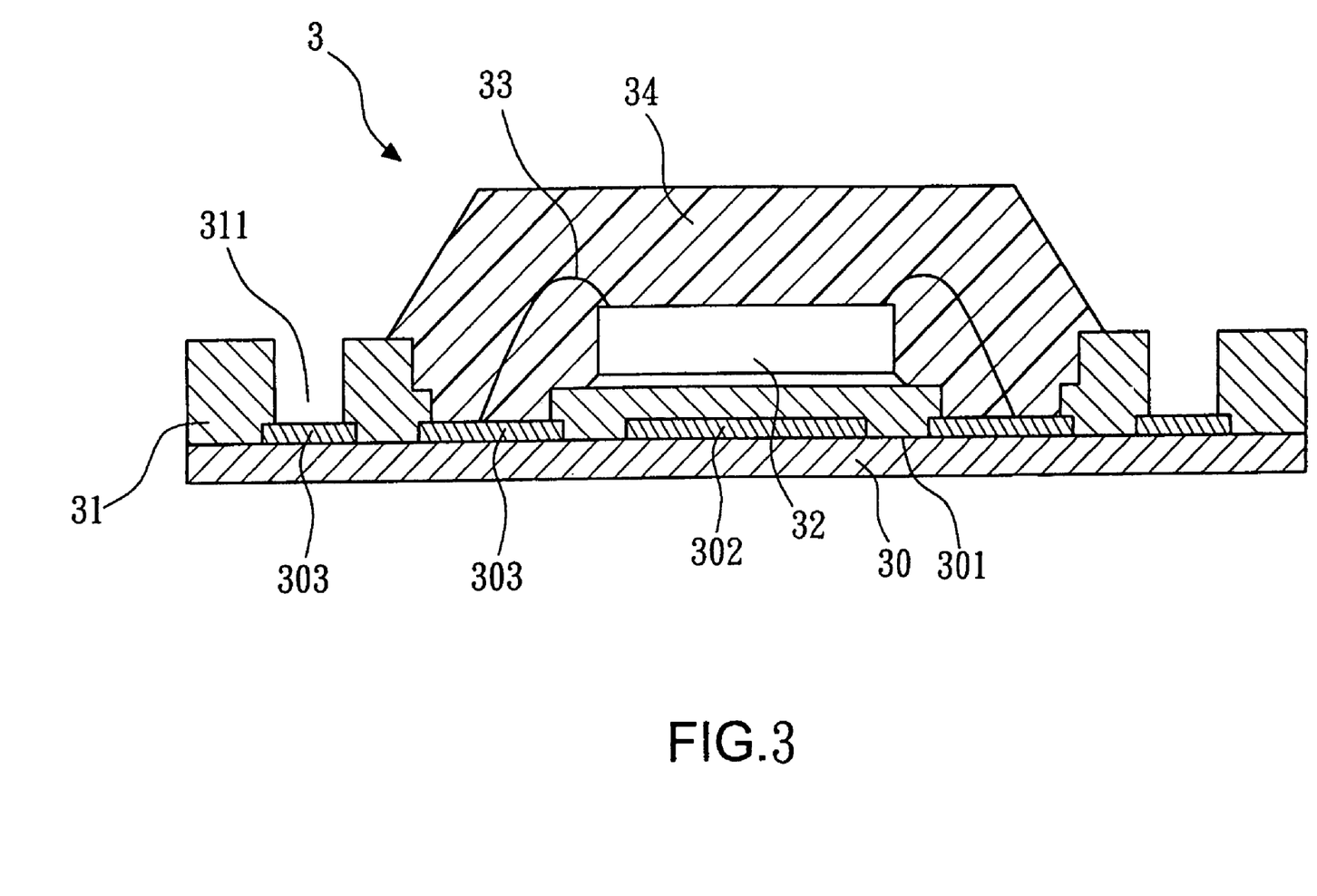
FIG. 3 shows a packaging structure having a solder mask according to a first embodiment of the present invention.

Referring to FIG. 3, it shows a packaging structure having a solder mask according to a first embodiment of the present invention. The packaging structure 3 of the invention comprises a substrate 30, a solder mask 31, a die 32, a plurality of wires 33 and molding compound 34. The substrate 30 has a top surface 301. The top surface 301 has a die pad 302 and a plurality of solder pads 303. The solder mask 31 is formed on the top surface 301. The solder mask 31 has a plurality of openings 311. Each opening 311 is corresponding to each solder pad 303 so as to expose part of the solder pad 303. The openings 311 are formed by using exposure and development. The solder mask 31 has a first portion 312 and a second portion 313. The first portion 312 is correspondingly on the die pad 302, and the second portion 313 is around the edge of the top surface 301 of the substrate 30. The first portion 312 is lower than the second portion 313, and the second portion 313 is formed as a stair-shaped structure.

The die 32 is attached on the first portion 312 of the solder mask 31 correspondingly on the die pad 302. The wires 33 are used to electrically connect the die 32 and the solder pads 303. The molding compound 34 is used to encapsulate the wires 33, the die 32 and the solder pads 303 to form the packaging structure 3.

Figure 4:
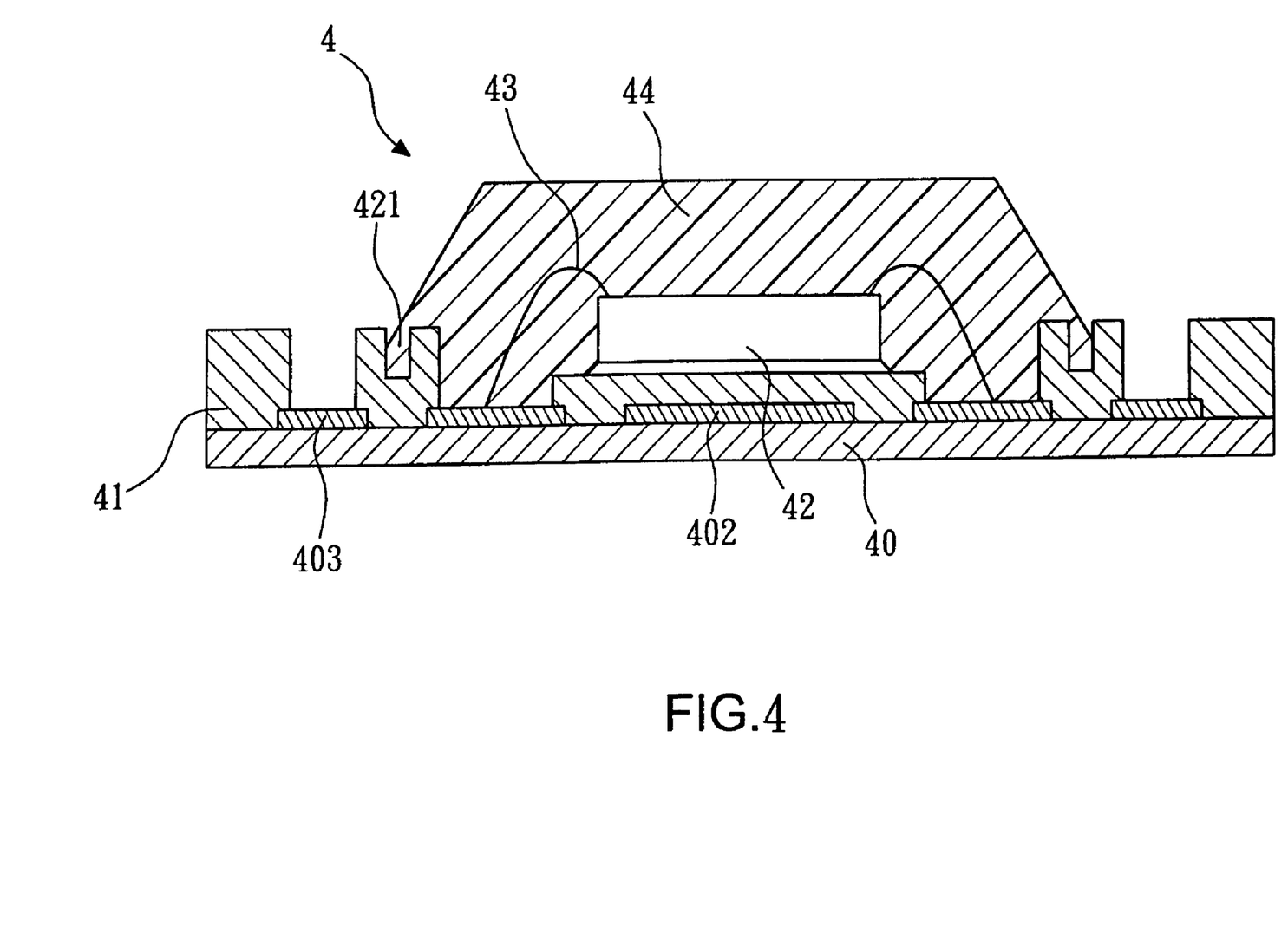
FIG. 4 shows a packaging structure having a solder mask according to a second embodiment of the present invention.

Referring to FIG. 4, it shows a packaging structure having a solder mask according to a second embodiment of the present invention. The packaging structure 4 of the invention comprises a substrate 40, a solder mask 41, a die 42, a plurality of wires 43 and molding compound 44. The difference between the packaging structure 4 according to the second embodiment and the packaging structure 3 according to the first embodiment is that a groove 421 may be formed on the solder mask 41 by using exposure and development in the second embodiment.

Figure 5:
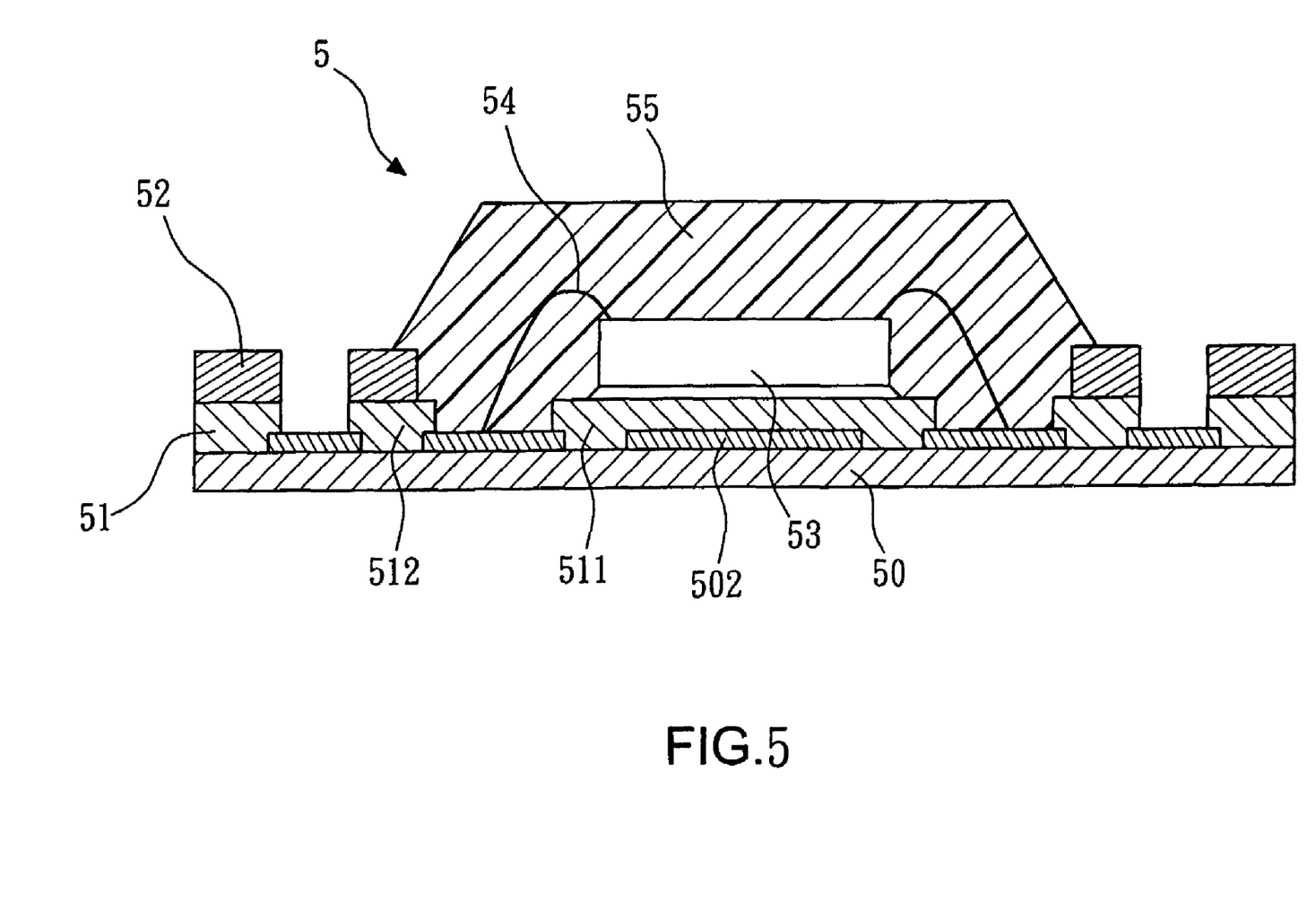
FIG. 5 shows a packaging structure having a solder mask according to a third embodiment of the present invention.

Referring to FIG. 5, it shows a packaging structure having a solder mask according to a third embodiment of the present invention. The packaging structure 5 of the invention comprises a substrate 50, a first solder mask 51, a second solder mask 52, a die 53, a plurality of wires 54 and molding compound 55. The difference between the packaging structure 5 according to the second embodiment and the packaging structure 3 according to the first embodiment is that the first solder mask 51 and the second solder mask 52 are a delaminated structure but not a single structure.

The first solder mask 51 has a first portion 511 and a second portion 512. The first portion 511 is correspondingly on the die pad 502, and the second portion 512 is around the edge of the top surface of the substrate 50. The second solder mask 52 is disposed on part of the first solder mask 51 (for example, on the second portion 512). The second solder mask 52 and the second portion 512 of the first solder mask 51 have a width difference to form as a stair-shaped structure.

Figure 6:
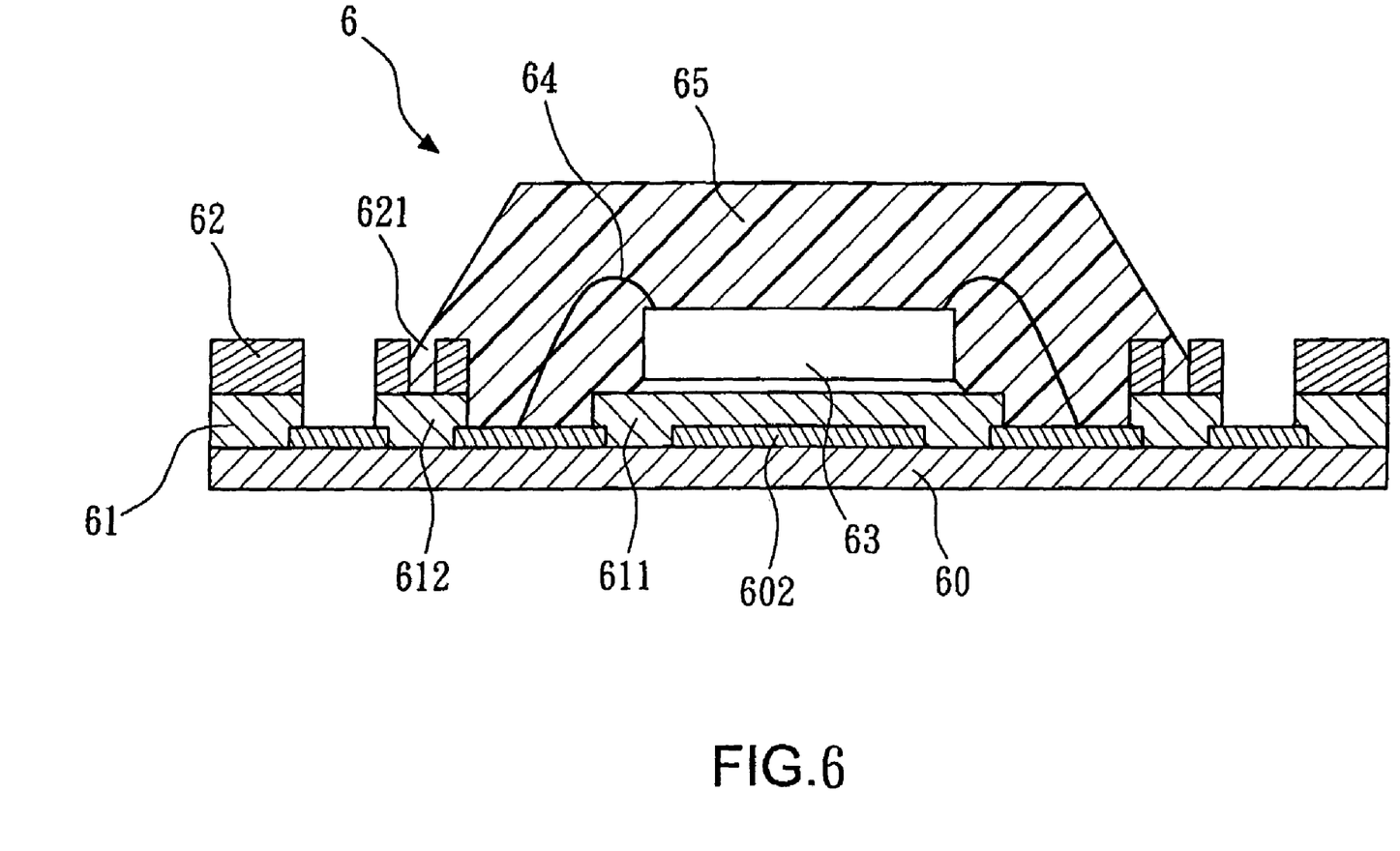
FIG. 6 shows a packaging structure having a solder mask according to a fourth embodiment of the present invention.

Referring to FIG. 6, it shows a packaging structure having a solder mask according to a fourth embodiment of the present invention. The packaging structure 6 of the invention comprises a substrate 60, a first solder mask 61, a second solder mask 62, a die 63, a plurality of wires 64 and molding compound 65. The difference between the packaging structure 6 according to the fourth embodiment and the packaging structure 4 according to the second embodiment is that the first solder mask 61 and the second solder mask 62 are a delaminated structure but not a single structure.

The first solder mask 61 has a first portion 611 and a second portion 612. The first portion 611 is correspondingly on the die pad 602, and the second portion 612 is around the edge of the top surface of the substrate 60. The second solder mask 62 is disposed on part of the first solder mask 61 (for example, on the second portion 612) and further has a ring-shaped groove 6211.

By utilizing the process for making a packaging structure of the present invention, the packaging structure of a single structure or of a delaminated structure can be formed. For the package of a single structure (as shown in FIG. 3 and FIG. 4), the first portion of the first solder mask is lower than the second portion. By utilizing the second portion, a thicker die can be used to be packaged so as to prevent the die crack. Furthermore, the second portion may form as a stair-shaped structure, and a ring-shaped groove may be formed on the second portion. Therefore, the overflow of molding compound will be avoided, and the solder pads will not be polluted.

In addition, for the package of a delaminated structure (as shown in FIG. 5 and FIG. 6), the first portion of the first solder mask is correspondingly on the die pad, the second portion is around the edge of the top surface of the substrate, and the second solder mask is disposed on the second portion of the first solder mask. Since the first solder mask and the second solder mask form a higher solder, a thicker die can be used to be packaged so as to prevent the die crack. Furthermore, the second portion of the first solder mask and the second solder mask form as a stair-shaped structure, and a ring-shaped groove may be formed on the second solder mask. Therefore, the overflow of molding compound will be avoided, and the solder pads will not be polluted.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A process for making a substrate structure having a solder mask, comprising the steps of:
   (a) providing a substrate having a top surface, the top surface having a die pad and a plurality of solder pads;
   (b) forming a first solder mask on the top surface, the first solder mask having a plurality of openings, each opening corresponding to each solder pad so as to expose at least part of the solder pad; and
   (c) forming a second solder mask on the first solder mask, wherein the second solder mask exposes the first solder mask covering the die pad, the first solder mask covering the die pad is defined as a first portion, the first solder mask and the second solder mask as stacked on the first solder mask on and around the top surface are defined as a second portion, and a height of the second portion is larger than a height of the first portion.

2. The process according to claim 1, wherein the openings are formed by using exposure and development in the step (b).

3. The process according to claim 1, further comprising the following steps after the step (c):

(c1) removing part of the second solder mask; and (c2) heating the first solder mask and the second solder mask so as to melt them to form a third solder mask.

4. The process according to claim 3, wherein part of the second solder mask is removed by using exposure and development.

5. The process according to claim 3, wherein the solder pads and part of the first solder mask are exposed after the step (c1).

6. The process according to claim 5, wherein the exposed first solder mask is correspondingly on the die pad.

7. The process according to claim 1, further comprising the following steps after the step (c):

(c1) removing part of the second solder mask to form at least one ring-shaped groove; and;

(c3) heating the first solder mask and the second solder mask so as to melt them to form a third solder mask.

8. The process according to claim 7, wherein part of the second solder mask is removed by using exposure and development.

9. The process according to claim 7, wherein the groove is formed by using exposure and development in the step (c1).

* * * * *